(12) United States Patent
Olivadese et al.

(10) Patent No.: US 11,804,641 B2
(45) Date of Patent: *Oct. 31, 2023

(54) REDUCED THERMAL RESISTANCE ATTENUATOR ON HIGH-THERMAL CONDUCTIVITY SUBSTRATES FOR QUANTUM APPLICATIONS

(71) Applicant: International Business Machines Corporation, Armonk, NY (US)

(72) Inventors: Salvatore Bernardo Olivadese, Stamford, CT (US); Patryk Gumann, Tarrytown, NY (US); Jay M. Gambetta, Yorktown Heights, NY (US); Jerry M. Chow, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/807,979

(22) Filed: Jun. 21, 2022

(65) Prior Publication Data
US 2023/0019142 A1    Jan. 19, 2023

Related U.S. Application Data

(60) Division of application No. 16/751,444, filed on Jan. 24, 2020, now Pat. No. 11,424,522, which is a
(Continued)

(51) Int. Cl.
*H01P 11/00* (2006.01)
*H01P 1/22* (2006.01)
(Continued)

(52) U.S. Cl.
CPC ............. *H01P 1/227* (2013.01); *G06N 10/00* (2019.01); *H01P 1/30* (2013.01); *H01P 11/003* (2013.01); *H10N 60/00* (2023.02)

(58) Field of Classification Search
CPC .. H01P 1/227; H01P 1/22; H01P 1/268; H01P 1/26; H01P 1/23; H01P 1/30; H01P 1/24; G06N 10/00
See application file for complete search history.

(56) References Cited

U.S. PATENT DOCUMENTS 4,965,538 A    10/1990   Mickey, III
5,332,981 A     7/1994   Mazzochette et al.
(Continued)

FOREIGN PATENT DOCUMENTS

CN    102741999 A    10/2012
CN    104981087 A    10/2015
(Continued)

OTHER PUBLICATIONS

U.S. Appl. No. 15/894,620, filed Feb. 12, 2018.
(Continued)

*Primary Examiner* — Stephen E. Jones
(74) *Attorney, Agent, or Firm* — Amin, Turocy & Watson, LLP

(57) ABSTRACT

Techniques for facilitating reduced thermal resistance attenuator on high-thermal conductivity substrates for quantum applications are provided. A device can comprise a substrate that provides a thermal conductivity level that is more than a defined thermal conductivity level. The device can also comprise one or more grooved transmission lines formed in the substrate. The one or more grooved transmission lines can comprise a powder substance. Further, the device can comprise one or more copper heat sinks formed in the substrate. The one or more copper heat sinks can provide a ground connection. Further, the one or more copper heat sinks can be formed adjacent to the one or more grooved transmission lines.

11 Claims, 10 Drawing Sheets

Related U.S. Application Data continuation of application No. 15/894,620, filed on Feb. 12, 2018, now Pat. No. 10,601,096.

(51) Int. Cl.
| | | |
|---|---|---|
| *H01P 1/30* | (2006.01) | |
| *G06N 10/00* | (2022.01) | |
| *H10N 60/00* | (2023.01) | |

(56) References Cited

U.S. PATENT DOCUMENTS

| | | | |
|---|---|---|---|
| 7,049,593 | B2 | 5/2006 | Sobolewski et al. |
| 7,855,615 | B1 | 12/2010 | Karr |
| 8,212,648 | B2 | 7/2012 | Yan et al. |
| 8,841,764 | B2 | 9/2014 | Poletto et al. |
| 8,878,626 | B2 | 11/2014 | Zmuidzinas et al. |
| 8,954,125 | B2 | 2/2015 | Corcoles Gonzalez et al. |
| 10,601,096 | B2 | 3/2020 | Olivadese et al. |
| 2002/0017963 | A1 | 2/2002 | Shimamoto et al. |
| 2003/0210103 | A1* | 11/2003 | Park .................. H01L 23/5283 257/E23.152 |
| 2006/0232357 | A1 | 10/2006 | Roldan et al. |
| 2009/0015355 | A1 | 1/2009 | Zeeb |
| 2009/0267201 | A1 | 10/2009 | Chang et al. |
| 2011/0084784 | A1 | 4/2011 | Das et al. |
| 2013/0258595 | A1 | 10/2013 | Tuckerman |
| 2015/0325900 | A1 | 11/2015 | Baba et al. |
| 2017/0132524 | A1 | 5/2017 | Abdo |
| 2017/0178018 | A1 | 6/2017 | Tcaciuc et al. |
| 2017/0237144 | A1 | 8/2017 | Tobar et al. |
| 2017/0257074 | A1 | 9/2017 | Yeh et al. |

FOREIGN PATENT DOCUMENTS

| | | | |
|---|---|---|---|
| CN | 105860141 | A | 8/2016 |
| CN | 107369706 | A | 11/2017 |
| EP | 0 656 670 | A2 | 6/1995 |
| EP | 3 109 575 | A1 | 12/2016 |
| EP | 3 217 336 | A1 | 9/2017 |
| JP | 2007-060084 | A | 3/2007 |
| WO | 98/00881 | A1 | 1/1998 |
| WO | 2018/004636 | A1 | 1/2018 |

OTHER PUBLICATIONS

U.S. Appl. No. 16/751,444, filed Jan. 24, 2020.
Yeh et al., "Microwave Attenuators for Use with Quantum Devices Below 100 mK," Journal of Applied Physics, 2017, 10 pages.
Swartz et al., "Thermal Boundary Resistance," Jul. 1989, Rev. Mod. Phys., vol. 61, No. 3, pp. 605-668, 64 pages.
Belitskii, "A Method of Manufacture and Some Properties of Sintered 20Cr-80Ni Nichrome," Sep. 1965, Translated from Poroshkovaya Metallurgiya, vol. 33, No. 9, pp. 59-64, Kiev Institute of Civil Aviation Engineers, 5 pages.
Touloukian et al., "Thermal Conductivity—Nonmetallic Solids," Thermophysical Properties of Matter—The TPRC Data Series, 1970, vol. 2, 1286 pages.
Simon, "Cryogenic Properties of Inorganic Insulation Material for Iier Magnets: A Review," NISTIR 5030, Dec. 1994, National Institute of Standards and Technology, 220 pages.
Carlson et al., "Therman Conductivity of GaAs and GaAs1-xPx Laser Semiconductors," Journal of Applied Physics, Feb. 1965, pp. 505-507, vol. 36, No. 2, American Institute of Physics, 4 pages.
Zagorodny et al., "Microwave Microstrip Attenuators for GaAs Monolithic Integrated Circuits," XIII International Conference and Seminar on Micro/Nanotechnologies and Electron Devices EDM, 2012, pp. 67-71, IEEE, 5 pages.
Chow, "Quantum Information Processing with Superconducting Qubits," May 2010, 322 pages.
Minev et al., "Planar Multilayer Circuit Quantum Electrodynamics," Physical Review Applied, 2016, vol. 5, American Physical Society, 9 pages.
Rolke, "Nichrome Thin Film Technology and its Application," Electrocomponent Science and Technology, 1981, pp. 51-57, vol. 9, Gordon and Breach Science Publishers Inc., 8 pages.
Glassbrenner et al., "Thermal Conductivity of Silicon and Germanium from 3° K to the Melting Point," Physical Review, May 1964, pp. A1058-A1069, vol. 134, No. 4A, 12 pages.
International Search Report and Written Opinion received for PCT Application Serial No. PCT/EP2019/051899 dated May 7, 2019, 13 pages.
Notice of Allowance received for U.S. Appl. No. 15/894,620 dated Jul. 29, 2019, 24 pages.
Notice of Allowance received for U.S. Appl. No. 15/894,631 dated Aug. 7, 2019, 24 pages.
Non Final Office Action received for U.S. Appl. No. 16/751,444 dated Mar. 17, 2021, 17 pages.
Final Office Action received for U.S. Appl. No. 16/751,444 dated Jun. 30, 2021, 11 pages.
Non Final Office Action received for U.S. Appl. No. 16/751,444 dated Dec. 13, 2021, 8 pages.
First Office Action received for Chinese Patent Application Serial No. 201980012370.8 dated Apr. 2, 2021, 19 pages.
Second Office Action received for Chinese Patent Application Serial No. 201980012370.8 dated Aug. 18, 2021, 17 pages.
Communication pursuant to Article 94(3) EPC received for European Patent Application Serial No. 19702552.1, dated Jul. 15, 2021, 5 pages.

* cited by examiner

REDUCED THERMAL RESISTANCE ATTENUATOR ON HIGH-THERMAL CONDUCTIVITY SUBSTRATES FOR QUANTUM APPLICATIONS

BACKGROUND

The subject disclosure relates to dissipative devices and, more specifically, to dissipative devices for use in quantum applications. The performance of a superconducting based quantum architecture can be heavily dependent on the quality state of superconducting qubits, which can be directly characterized by the measuring coherence times and qubit errors. These times and errors can strongly depend on the performance of microwave hardware at low temperatures (e.g., cryogenic temperatures). To increase coherence times the microwave components and associated control lines should be thermalized to mitigate and/or reduce the amount of thermal noise produced from room temperature electronics.

For example, Yeh et al. (U.S. Patent Application Publication No. 2017/0257074) discusses an ultra-low temperature dissipative device that "is configured as a coplanar waveguide microwave attenuator with a central conductor between a pair of ground planes." See paragraph [0064]. As discussed in Yeh et al, "a dissipative device functioning as an attenuator can be formed of multiple individual attenuator cells," See paragraph [0071]. "A coupling region can be provided with capacitors (e.g., interdigitated comb fingers) can couple input/output between adjacent cells. See id. (reference characters removed for clarity). Yeh et al., however, lacks in efficiency from both microwave and thermalization perspectives and can be difficult to implement. Further, Yeh et al. does not have a good trade-off between thermal and microwave performance.

SUMMARY

The following presents a summary to provide a basic understanding of one or more embodiments of the invention. This summary is not intended to identify key or critical elements, or delineate any scope of the embodiments or any scope of the claims. Its sole purpose is to present concepts in a simplified form as a prelude to the more detailed description that is presented later. In one or more embodiments described herein, systems, computer-implemented methods, methods, apparatuses, devices, and/or computer program products that facilitate reduced thermal resistance attenuator on high-thermal conductivity substrates for quantum applications are provided.

According to an embodiment, provided is a device that can comprise a substrate that provides a thermal conductivity level that can be more than a defined thermal conductivity level. The device can also comprise one or more grooved transmission lines formed in the substrate. The one or more grooved transmission lines can comprise a powder substance. Further, the device can comprise one or more copper heat sinks formed in the substrate. The one or more copper heat sinks can provide a ground connection. Further, the one or more copper heat sinks can be formed adjacent to the one or more grooved transmission lines.

The substrate can comprise material selected from a group comprising sapphire, silicon, fused silica, quartz, Magnesium Oxide (MgO), and Gallium Arsenide (GaAs). Further, the thermal conductivity level of the substrate can be in a range of around 100 watts to around 200 watts per meter per Kelvin (W/m/K).

The one or more grooved transmission lines can comprise powder selected from a group comprising Nichrome (NiCr), copper, platinum, silver, and brass. The one or more grooved transmission lines can facilitate thermalization to reduce a metal-substrate interfacial thermal resistance.

In an example, the device can comprise a ground plane, wherein the substrate is over the ground plane. According to an implementation, the device can also comprise one or more resistors formed in the one or more grooved transmission lines. The one or more resistors can comprise a resistivity level higher than a defined resistivity level. Further, the one or more heat sinks can absorb heat from the one or more resistors. In an implementation, the device can be a microwave attenuator device that can be employed in cryogenic environments.

Another embodiment relates to a method that can comprise milling one or more transmission lines in a substrate that provides a thermal conductivity level that can be more than a defined thermal conductivity level. The method can also comprise filling the one or more transmission lines with a powder substance. In addition, the method can comprise forming one or more copper heat sinks in the substrate adjacent to the one or more transmission lines. Further, the method can comprise electrically grounding the one or more copper heat sinks.

The thermal conductivity level of the substrate can be in a range of about 100 watts to about 200 watts per meter per Kelvin (W/m/K). The substrate can comprise a material selected from a group comprising sapphire, silicon, fused silica, quartz, Magnesium Oxide (MgO), and Gallium Arsenide (GaAs). In an example, the substrate can have a thickness of 1.0 millimeter or less. However, the disclosed aspects are not limited to this implementation and other dimensions, including dimensions more than 1.0 mm can be utilized.

Filling the one or more transmission lines with the powder substance can comprise filling the one or more transmission lines with a powder selected from a group comprising Nichrome (NiCr), copper, platinum, silver, and brass. In an example, the one or more transmission lines can facilitate thermalization to reduce a metal-substrate interfacial thermal resistance. According to another example, the device can comprise a ground plane, wherein the substrate is located over the ground plane.

According to some implementations, the method can also comprise forming one or more resistors in the substrate. The one or more resistors can comprise a resistivity level higher than a defined resistivity level. Further, the one or more heat sinks can absorb heat from the one or more resistors.

A further embodiment relates to a microwave attenuator device that can comprise a substrate that provides a thermal conductivity level that can be more than a defined thermal conductivity level. The microwave attenuator device can also comprise one or more grooved transmission lines formed in the substrate. The one or more grooved transmission lines can comprise a powder substance. Further, the microwave attenuator device can comprise one or more copper heat sinks formed in the substrate. The one or more copper heat sinks can provide a ground connection and can be formed adjacent to the one or more grooved transmission lines.

In an implementation, the substrate can comprise a material selected from a group comprising sapphire, silicon, fused silica, quartz, Magnesium Oxide (MgO), and Gallium Arsenide (GaAs). Further to this implementation, the one or more grooved transmission lines can comprise powder selected from a group comprising Nichrome (NiCr), copper, platinum, silver, and brass.

According to some implementations, the thermal conductivity level of the substrate can be in a range of about 100 watts to about 200 watts per meter per Kelvin (W/m/K). Further, the one or more grooved transmission lines can facilitate thermalization to reduce a metal-substrate interfacial thermal resistance.

Advantages of the various aspects provided herein include, for example, improved thermalization due to the higher thermal conductivity of the substrate. Another advantage includes improved thermalization and reduced thermal noise due to the lower Kapitza resistance. Still another advantage can be reduced Joule heating from the resistance due to the presence of heat sinks.

DETAILED DESCRIPTION

Figure 1:
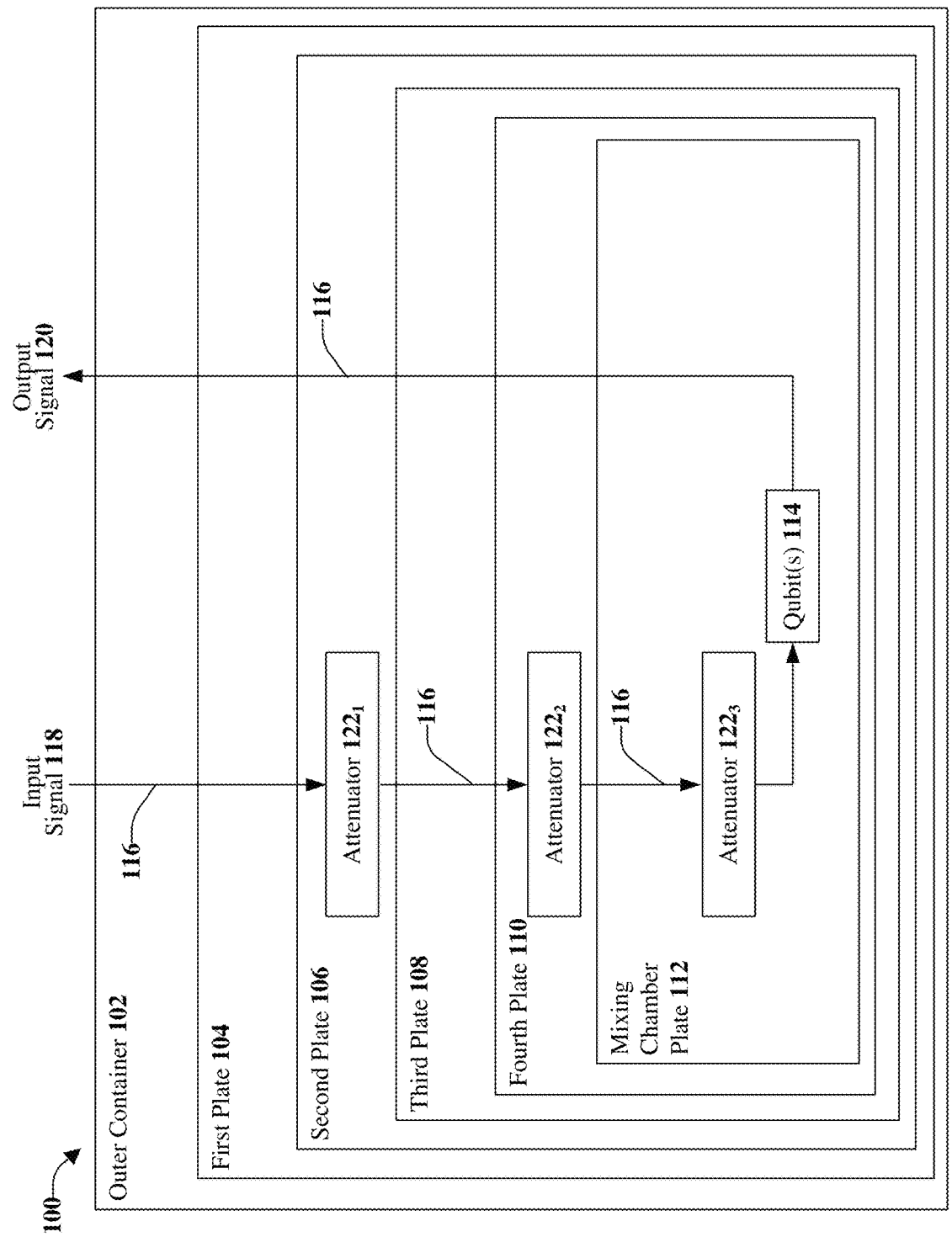
FIG. 1 illustrates a schematic representation of a side cutaway view of a cryostat that can be utilized for quantum computing applications in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum computer can employ quantum bits (e.g., qubits) that operate according to a superposition principle of quantum physics and an entanglement principle of quantum physics. The superposition principle of quantum physics allows respective qubits to represent both a value of "1" and a value of "0" at the same time. The entanglement principle of quantum physics states allows qubits in a superposition to be correlated with one other. For instance, a state of a first value (e.g., a value of "1" or a value of "0") can depend on a state of a second value. As such, a quantum computer can employ qubits to encode information rather than binary digital techniques that are based on the use of transistors.

Embodiments described herein comprise devices, systems, methods, computer-implemented methods, computer program products, and products that can allow for better and faster thermalization of the microwave components and cleaner microwave signals through utilization of an attenuator design that comprises high thermal conductivity materials. Specifically, one or more of the various aspects can facilitate better thermalization of microwave control lines (e.g., coax cables), as compared to conventional techniques. The better thermalization can provide longer coherence times, which can lead to overall improved performance of quantum computers and quantum processors. Further, one or more of the various aspects can facilitate cleaner microwave control pulses by mitigating and/or reducing the amount of reflection points in a form of minimizing and/or reducing unnecessary microwave connections (which are not always 50 Ohm impedance matched). Thus, as will be discussed in further detail below, compared with conventional techniques, the one or more aspects provided herein can perform better, both in terms of thermalization and microwave response, due, in part, to the use of materials with a high thermal conductivity and an accurate design.

In further detail, for quantum processors, information can be entered the qubits to perform a computing function, which can be performed provided the qubits are in a superposition state. Although the superposition state is fragile, it should last as long as possible. However, due to thermal fluctuations traveling down the coax cables, the superposition state decoheres and disappears, which will be discussed in further detail below.

FIG. 1 illustrates a schematic representation of a side cutaway view of a cryostat 100 that can be utilized for quantum computing applications in accordance with one or more embodiments described herein. A "cryostat" is a device used to maintain low cryogenic temperatures and, more specifically to maintain a quantum computing processor at a low cryogenic temperature. Although discussed with respect to quantum applications, the disclosed aspects can be utilized with other cryogenic applications.

As illustrated, the cryostat 100 can comprise an outer container 102 that can house one or more plates (e.g., refrigerators) that can be nested to gradually reduce a temperature from room temperature to an operating temperature. For example, there can be many different plates that can be utilized to thermalize the environment (e.g., gradually reduce the temperature from room temperature to the operating temperature). Accordingly, radiated heat, which can be introduced into respective environments of the different plates through a coax cable, can be mitigated and/or reduced.

The outer container 102 can be referred to as an outer vacuum. Further, the outer container 102 can be at room temperature (e.g., around 300 degrees Kelvin (300° K), around 80 degrees Fahrenheit (80° F.), or around 27 degrees Celsius (27° C.)) and, thus, can be referred to as a 300 Kelvin plate. The plates, nested within the outer container 102, can be in the form of cylinders, which can be approximately two feet in diameter, although other shapes and/or diameters can also be utilized. Illustrated are five plates, namely, a first plate 104, a second plate 106, a third plate 108, a fourth plate 110, and a fifth plate, referred to as a mixing chamber plate 112. The one or more plates can be made from copper, according to an implementation. Although five plates are illustrated and described, various embodiments can utilize less than five plates, or more than five plates, depending on the implementation.

The first plate 104 can be utilized to reduce the temperature from room temperature (e.g., the temperature of the outer container 102) to about 50° K. Thus, the first plate 104 can have a temperature of 50° K and can also be referred to as a 50 Kelvin plate. The second plate 106 can be utilized to reduce the temperature from 50° K to around 3° K (referred to as a 3 Kelvin plate). The third plate 108 can be utilized to reduce the temperature from 3° K to approximately 1° K (or about 0.71° K) and can also be referred to as a still plate. Further, the fourth plate 110 can be utilized to reduce the temperature from 1° K to about 0.1° K (100 millikelvin) and can also be referred to as a cold plate. At the mixing chamber plate 112, the temperature can be reduced from about 0.1° K to about 0.01° K (10 millikelvin), which roughly corresponds to −273° C. or −480° F. Quantum processors and devices can be installed in, or can be operatively attached to the mixing chamber plate 112. For example, there can be a piece of metal (e.g., copper) onto which (silicon) superconducting qubits can be attached. The piece of metal can be attached to the mixing chamber plate 112.

To transfer a code/program (e.g., a quantum algorithm) for processing at one or more qubits 114, located in the mixing chamber plate 112, a cable 116 (or multiple cables or multiple sections of cable) can be utilized. The cable 116 can be, for example, a microwave cable, a coax cable, or another type of cable. An input signal 118 of the code/program can be input at a first end of the cable 116, processing can be performed by the one or more qubits 114, and an output signal 120 can be output at a second end of the cable 116.

For example, the input signal 118 can be provided by one or more devices (e.g., a computer, a processor, and so on) that are external to the cryostat 100. Accordingly, the one or more qubits 114, which can be attached to one or more pieces of silicon, can be wire bound to be operatively connected to the one or more external devices. The connection(s) between the one or more external devices can be facilitated by the cable 116, which can be passed through the respective plates (e.g., the first plate 104, the second plate 106, the third plate 108, the fourth plate 110, and the mixing chamber plate 112).

In further detail, the cable 116 can be inserted in the outer container 102 (e.g., at the first end of the cable) through an opening formed in the outer container 102 and attached with a connector. The cable 116 can be passed through the nested layers (e.g., the first plate 104, the second plate 106, the third plate 108, the fourth plate 110, and the mixing chamber plate 112) through respective holes cut in the layers. The cable 116 can also be connected at different devices, such as a first attenuator device $122_1$, a second attenuator device $122_2$, a third attenuator device $122_3$, one or more other attenuator devices, and/or the one or more qubits 114. Further, the cable 116 can be routed back through the nested layers (e.g., the mixing chamber plate 112, the fourth plate 110, the third plate 108, the second plate 106, and the first plate 104) and output through another opening formed in the outer container 102 (e.g., at the second end of the cable).

According to some implementations, the cable 116 can be divided into sections. For example, a first section of cable, having connectors on both ends, can be placed between the outer container 102 (e.g., the 300 Kelvin plate) and the first plate 104 (e.g., the 50 Kelvin plate). A second section of cable, having connectors on both ends, can be placed between the first plate 104 and the second plate 106 (e.g., the 3 Kelvin plate). A third section of cable, having connectors on both ends, can be placed between the second plate 106 and the third plate 108 (e.g., the still plate). A fourth section of cable, having connectors on both ends, can be placed between the third plate 108 and the fourth plate 110 (e.g., the cold plate). Further, a fifth section of cable can be place between the fourth plate 110 and the mixing chamber plate 112.

The attenuators (e.g., the first attenuator device $122_1$, the second attenuator device $122_2$, the third attenuator device $122_3$, and/or other attenuator devices) can be operatively attached (e.g., robustly anchored) within (or directly to) the one or more plates for the sections of the cable 116 to be attached. Accordingly, the entire chain of the cable 116 can be connected through the plates to the one or more qubits 114.

To facilitate connections of the cable between the plates, respective microwave connectors can be utilized at the one or more connection points. The microwave connectors can be SMA (Subminiature A) connectors according to an aspect; however, other types of connectors can be utilized with the one or more aspects discussed herein. Since the cable 116 passes through the one or more plates, the connectors should be properly thermalized, such that thermal heat is not transferred from the outer container 102 to the one or more qubits 114.

For example, a problem associated with conventional techniques is that the connection points and/or attenuators, which can be cryo-attenuators, perform at only around 77° K. As such, the attenuators are not properly thermalized and, therefore, thermal noise from the room temperature external devices can be transferred to the one or more qubits 114 through the cable 116. Accordingly, the various aspects discussed herein provide attenuators that can be thermalized to minimize and/or reduce thermal noise coming from the room temperature electronics and down through the various plates of the cryostat 100. Further details related to the attenuators provided herein will be discussed in further detail with reference to the following figures.

Although discussed with respect to a single cable, it is noted that there can be more than one cable. For example, different sections of cable can be utilized between the different layers and/or devices (e.g., attenuators, qubits, and so on). Further, the different sections of cable can be formed of different materials (e.g., copper nickel (CuNi), Niobium (Nb)). It is also noted that other devices (e.g., one or more low pass filters, one or more isolators, one or more amplifiers, one or more metal shields surrounding the one or more qubits, and so on) can be included in the cryostat 100 but are not illustrated for purposes of simplicity.

Figure 2:
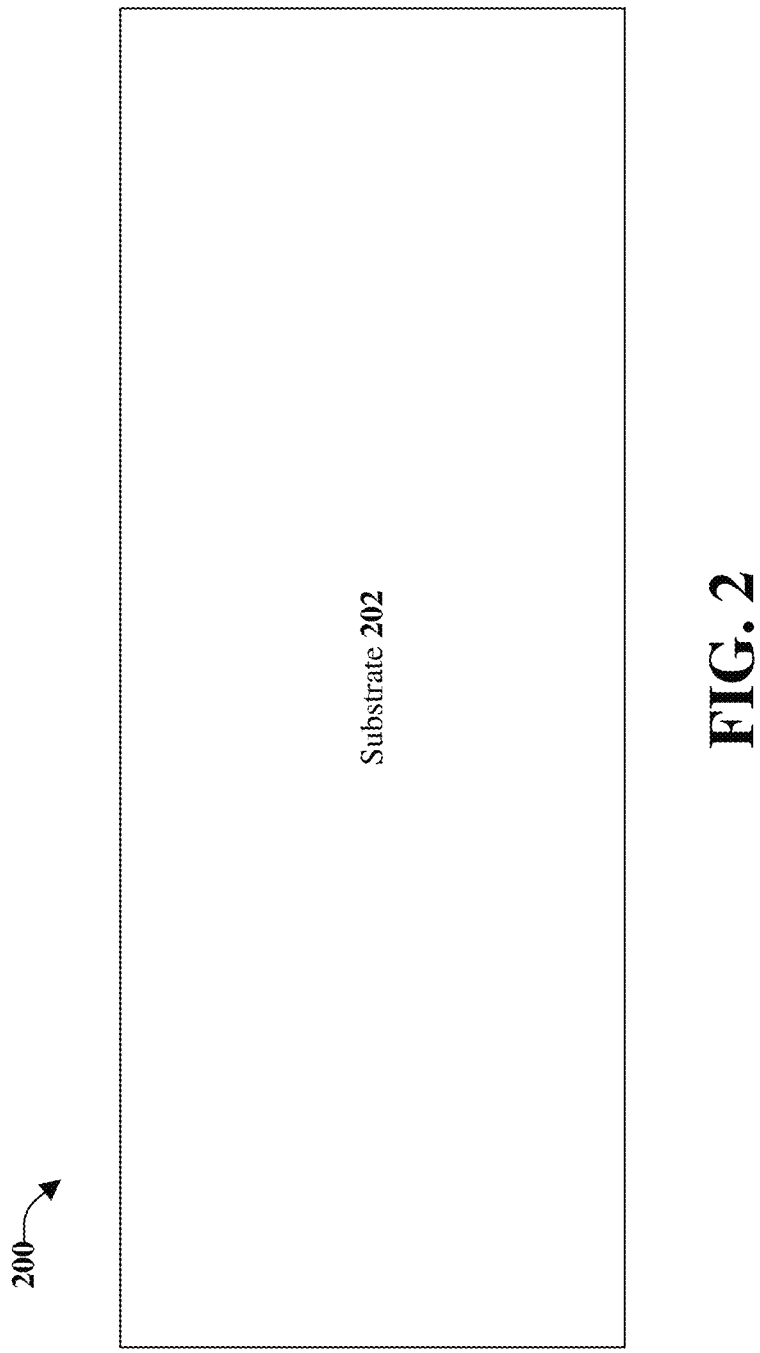
FIG. 2 illustrates a cross sectional top view of formation of an attenuator that minimizes and/or reduces thermal resistance in accordance with one or more embodiments described herein.

FIG. 2 illustrates a cross sectional top view of formation of an attenuator 200 that minimizes and/or reduces thermal resistance in accordance with one or more embodiments described herein. The attenuator 200 can be a microwave attenuator device that can be employed in cryogenic environments. The various aspects can facilitate proper thermalization of the microwave components and associated control lines to increase the coherence times and thus improve the functionality of the quantum processors.

As it relates to quantum applications, in some cases, thermal noise can increase due to Joule heating in resistors. Further, a substrate made of GaAs and/or Alumina can have poor thermal conductivity at low temperatures (e.g., cryogenic temperatures). Further, interfacial thermal resistance (Kaptiza resistance) can grow at low temperatures. The various aspects provided herein relate to a cross-type design microwave attenuator that comprises a substrate with a high thermal conductivity. Further, grooved lines can reduce Kapitza resistance. Additionally, heat sinks can provide thermal efficiency.

The attenuator 200 can comprise a substrate 202 that can provide a thermal conductivity level that is more than a defined thermal conductivity level. For example, the thermal conductivity level of an Alumina Tc (technetium) substrate, which has been conventionally utilized for cryogenic (e.g., quantum) environments, has a thermal conductivity level of around 50 to 80 watts per meter per Kelvin (W/m/K). However, according to an implementation, the thermal conductivity level of the substrate 202 can be in a range of around 100 to around 200 watts per meter per Kelvin (W/m/K). According to another example, the thermal conductivity level can have a lower bound of around 50 to 80 W/m/K (e.g., Alumina). In accordance with another example, an upper bound for the thermal conductivity level can be dependent on the material utilized, which can be sapphire or can be another material that has a higher thermal conductivity level. The substrate 202 can comprise a material selected from a group of materials that comprise sapphire, silicon, fused silica, quartz, Magnesium Oxide (MgO), and Gallium Arsenide (GaAs), or a combination thereof.

In an implementation, the substrate 202 can be a sapphire substrate. The sapphire substrate can have a thickness of less than 1.0 mm. However, in some implementations, the substrate 202 can have a thickness of 1.0 mm or more. A thermal conductivity level of the sapphire substrate can be approximately 200 W/m/K. According to another implementation, the substrate 202 can be a Gallium Arsenide (GaAs) substrate. A thermal conductivity level of the Gallium Arsenide substrate can be approximately 100 W/m/K.

Figure 3:
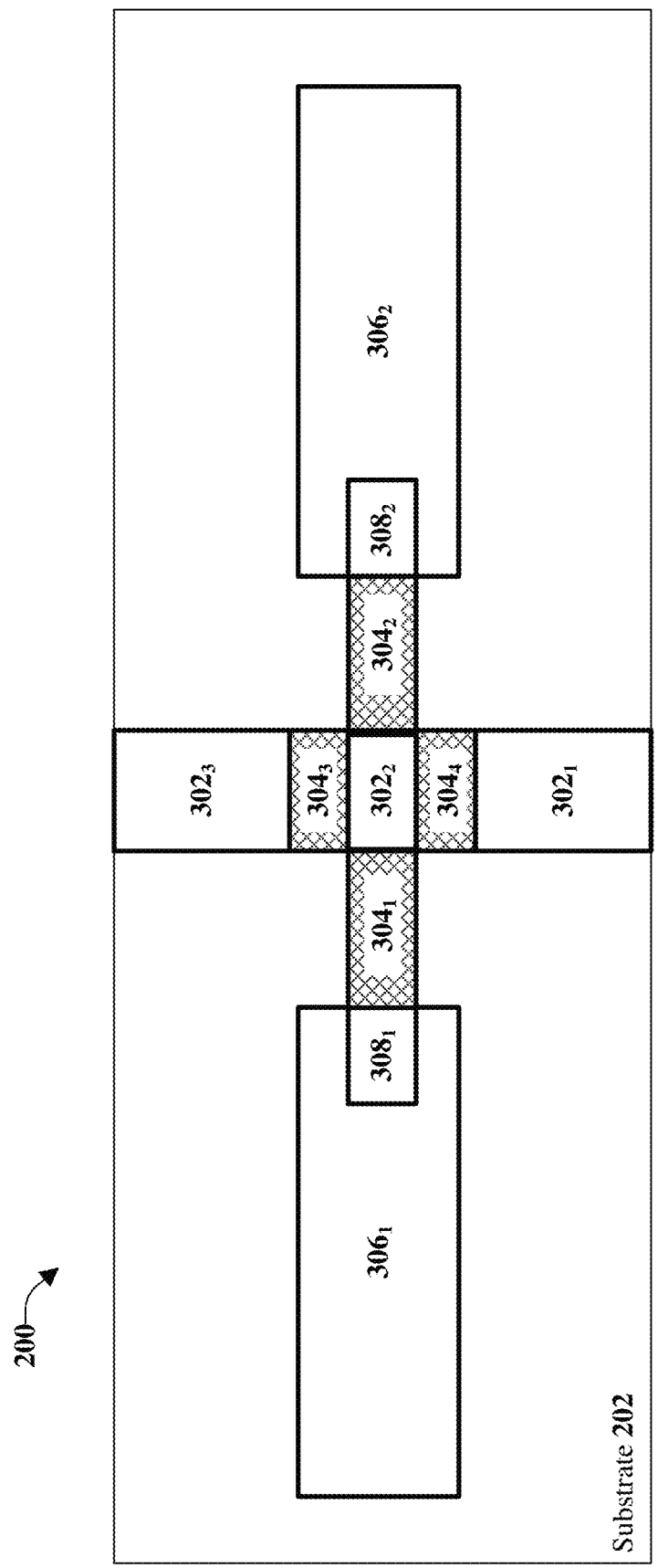
FIG. 3 illustrates a cross sectional top view of creating one or more trenches in the substrate of the attenuator of FIG. 2 in accordance with one or more embodiments described herein.

FIG. 3 illustrates a cross sectional top view of creating one or more trenches in the substrate 202 of the attenuator 200 of FIG. 2 in accordance with one or more embodiments described herein. Repetitive description of like elements employed in other embodiments described herein is omitted for sake of brevity.

One or more trenches can be etched or grooved into the substrate 202. The one or more trenches can be placed at defined areas of the substrate 202. Further, the one or more trenches can comprise trenches of various depths, various thicknesses, and/or various lengths. By way of example and not limitation, the attenuator 200 can comprise shallow trenches and deep trenches. The deep trenches can be etched deeper into the substrate 202 than the shallow trenches.

One or more shallow trenches can be utilized for one or more transmission lines. The trenches for the transmission lines are illustrated at $302_1$, $302_2$, and $302_3$. The one or more transmission lines can facilitate thermalization to reduce a metal-substrate interfacial thermal resistance. Trenches of the one or more shallow trenches can also be utilized for one or more resistors. The trenches for the resistors are illustrated at $304_1$, $304_2$, $304_3$, and $304_4$.

The attenuator 200 can also comprise one or more deep trenches. The deep trenches can be utilized for heat sinks, for example. The trenches for the heat sinks are illustrated as a first heat sink $306_1$ and a second heat sink $306_2$. The deep trenches can be cut deeper into the substrate 202 than the shallow trenches. Although two deep trenches are illustrated and described, more than two deep trenches can be utilized with the disclosed aspects. Also illustrated are respective connections $308_1$ and $308_2$ to the first heat sink $306_1$ and the second heat sink $306_2$ (and ground).

Figure 4:
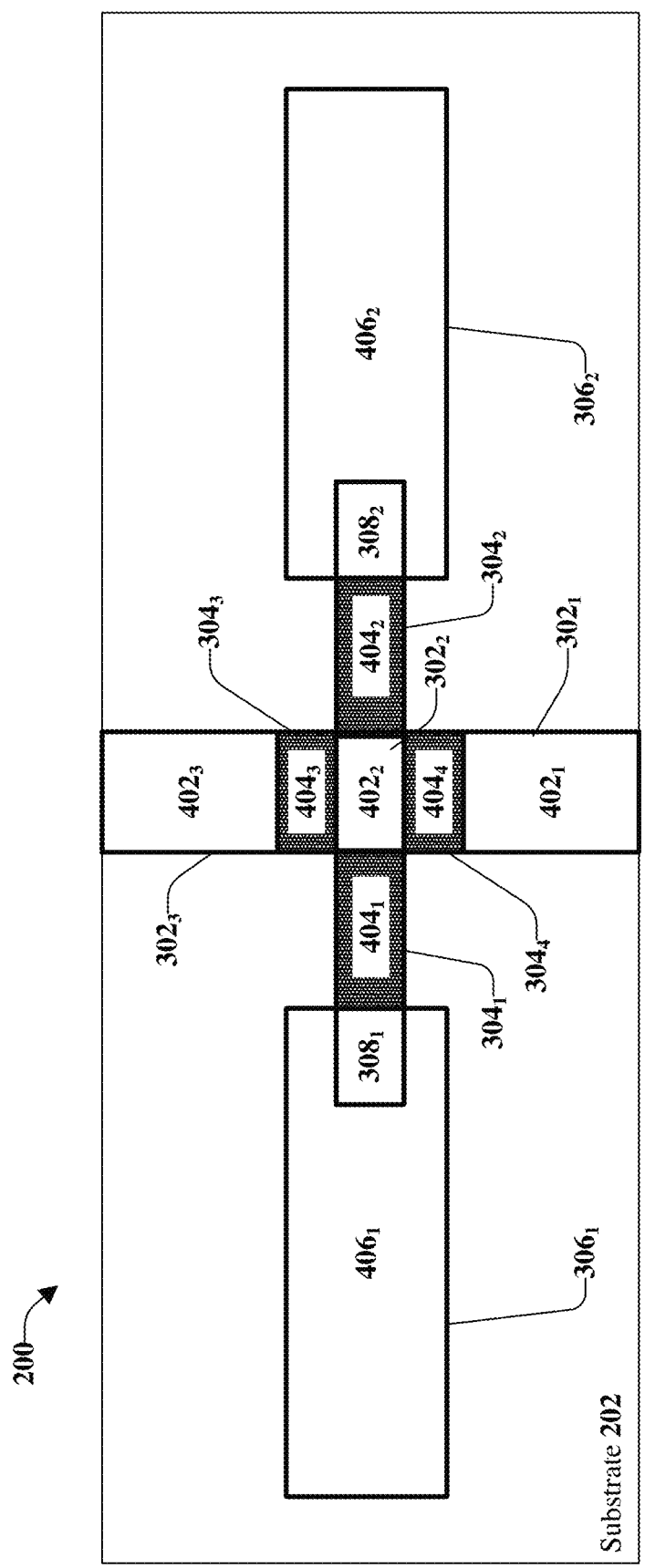
FIG. 4 illustrates a cross-sectional top view of filling the one or more trenches in the substrate of the attenuator of FIG. 3 in accordance with one or more embodiments described herein.

FIG. 4 illustrates a cross-sectional top view of filling the one or more trenches in the substrate 202 of the attenuator 200 of FIG. 3 in accordance with one or more embodiments described herein. Repetitive description of like elements employed in other embodiments described herein is omitted for sake of brevity.

The trenches for the transmission lines, namely, a first transmission line $302_1$, a second transmission line $302_2$, and a third transmission line $302_3$ can be filled with a first powder substance. For example, the trenches for the transmission lines (e.g., the first transmission line $302_1$, the second transmission line $302_2$, and the third transmission line $302_3$) can be filled with respective powder substances $402_1$, $402_2$, and $402_3$. The respective powder substances $402_1$, $402_2$, and $402_3$ can be packed into the trenches for the one or more transmission lines (e.g., the first transmission line $302_1$, the second transmission line $302_2$, and the third transmission line $302_3$) such that top surfaces of the respective powder substances $402_1$, $402_2$, and $402_3$ are substantially level with a top plane of the substrate 202. According to some implementations, the respective powder substances $402_1$, $402_2$, and $402_3$ can be particles formed in one or more geometric shapes (e.g., sphere, circular, square, and so on). According to some implementations, the trenches for the one or more transmission lines (e.g., the first transmission line $302_1$, the second transmission line $302_2$, and the third transmission line $302_3$) can be filled with a powder selected from a group comprising Nichrome (NiCr), copper, platinum, silver, and brass, or a combination thereof.

In some implementations, different amounts of the first powder substance (e.g., respective powder substances $402_1$, $402_2$, and $402_3$) can be utilized for the transmission lines. For example, a first shallow trench can comprise a first amount of powder substance and a second shallow trench can comprise a second amount of the powder substance. The first amount and the second amount can be the same amount, a similar amount, or a different amount.

According to some implementations, the trenches for the resistors $304_1$, $304_2$, $304_3$, and $304_4$ can be filled (and packed with) a second powder substance. For example, the trenches for the resistors $304_1$, $304_2$, $304_3$, and $304_4$ can be filled with respective powder substances $404_1$, $404_2$, $404_3$, and $404_4$. The respective powder substances $404_1$, $404_2$, $404_3$, and $404_4$ can be packed into the trenches for the transmission lines at $304_1$, $304_2$, $304_3$, and $304_4$ such that top surfaces of the respective powder substances $404_1$, $404_2$, $404_3$, and $404_4$ are substantially level with a top plane of the substrate 202. According to some implementations, the respective powder substances $404_1$, $404_2$, $404_3$, and $404_4$ can be particles formed in one or more geometric shapes (e.g., sphere, round, square, and so on). In some implementations, different amounts of the second powder substance (e.g., respective powder substances $402_1$, $402_2$, and $402_3$) can be utilized for the resistors. In an example, the one or more resistors can be filled with powder substances $404_1$, $404_2$, $404_3$, and $404_4$ that can comprise high resistivity metals. In one specific example, the powder substances can be Nichrome (NiCr). Further to this example, the NiCr can be a 70/30 ratio film (e.g., 70 percent nickel and 30 percent chrome). It is noted that the disclosed aspects are not limited to NiCr, instead various metal alloys with a relatively high resistivity (e.g., in the range of 100 microhm centimeter (100 uOhm cm) can be utilized.

According to some implementations, the one or more transmission lines can increase a capacitive resistance of the attenuator 200. An increased capacitive resistance can lower a thermal noise of the microwave pulses (e.g., of the cable 116), which can provide better thermalization. To increase the capacitive resistance, the powder substance that fills the one or more transmission lines can increase a surface area of the transmission lines. The increased surface area can correspond to an increased thermal conductivity of the attenuator 200.

The trenches for the first heat sink $306_1$ and the second heat sink $306_2$ can be formed in the substrate and adjacent to the one or more grooved transmission lines. For example, a first heat sink $306_1$ can be formed adjacent to a first transmission line $302_1$ and a second heat sink $306_2$ can be formed adjacent to a second transmission line $302_2$. The one or more heat sinks can provide a ground connection (e.g., an electrical ground connection). Further, the one or more heat sinks can absorb heat from the one or more resistors.

According to some implementations, the respective trenches for the first heat sink $306_1$ and the second heat sink $306_2$ can be filled with copper. Thus, the respective trenches for the first heat sink $306_1$ and the second heat sink $306_2$ can be copper can be filled with respective copper powder $406_1$ and $406_2$. The copper powder can be compressed within the respective trenches for the first heat sink $306_1$ and the second heat sink $306_2$. The respective copper powder $406_1$ and $406_2$ can be packed into the respective trenches for the first heat sink $306_1$ and the second heat sink $306_2$ such that top surfaces of the respective copper powder $406_1$ and $406_2$ are substantially level with a top plane of the substrate 202.

In some implementations, different amounts of copper powder (e.g., the respective copper powder $406_1$ and $406_2$) can be utilized for the respective trenches for the first heat sink $306_1$ and the second heat sink $306_2$. For example, a first trench for first heat sink $306_1$ can be filled with a first amount of a copper powder $406_1$ and second trench for the second heat sink $306_2$ can be filled with a second amount of the copper powder $406_2$. The first amount and the second amount can be a same amount, a similar amount, or a different amount. According to some implementations, the respective copper powder $406_1$ and $406_2$ can be particles formed in one or more geometric shapes (e.g., sphere, round, square, and so on). The copper powder can increase a surface area of the one or more heat sinks.

As discussed herein, by placing a large quantity of particles (e.g., powder particles) into the grooved trenches, the respective surface areas can be automatically increased. Since the surface areas can be increased, a corresponding increase to the thermal conductivity can be achieved due to minimizing and/or reducing the capacitor resistance.

In an example, the substrate 202 can be over a ground plane. A ground plane can be utilized because the transmission line(s) used is a microstrip type of transmission line.

Figure 5:
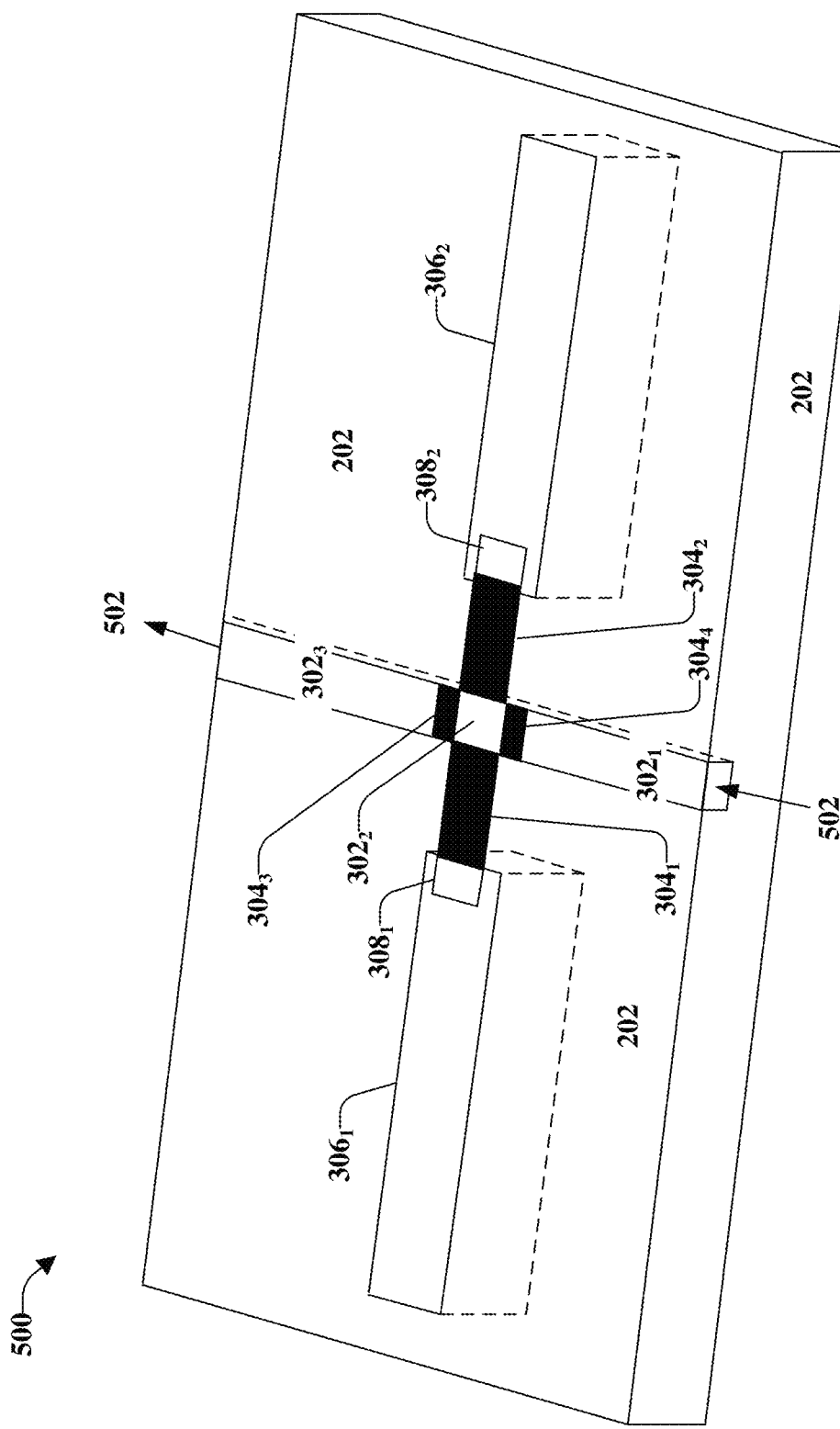
FIG. 5 illustrates a perspective view of the substrate of FIGS. 2-4 in accordance with one or more embodiments described herein.

FIG. 5 illustrates a perspective view of the substrate 202 of FIGS. 2-4 in accordance with one or more embodiments described herein. Repetitive description of like elements employed in other embodiments described herein is omitted for sake of brevity.

Microwave signals can travel in the direction of arrows 502. Further, as illustrated, the shallow trenches (e.g., the trenches for the first transmission line $302_1$, the second transmission line $302_2$, and the third transmission line $302_3$, the trenches for the resistors $304_1$, $304_2$, $304_3$, and $304_4$) can be shallower that the deep trenches (e.g., the respective trenches for the first heat sink $306_1$ and the second heat sink $306_2$), which can be trenches or grooves that can extend deep into the substrate 202. As mentioned with respect to FIG. 4, the trenches can be filled with respective types of powder, which can be in the form of spheres or round particles (although another geometric shape can be utilized with the disclosed aspects). By placing a large quantity of particles into the grooved trenches, the surface areas can be automatically increased. Since the surface areas can be increased, a corresponding increase to the thermal conductivity can be achieved due to minimizing and/or reducing the capacitor resistance.

In accordance with some implementations, the attenuator chip can be placed in a housing. For example, the housing can be an oxygen-free or electrolytic high-conductivity copper housing for improved thermalization to refrigerator plates.

Figure 6:
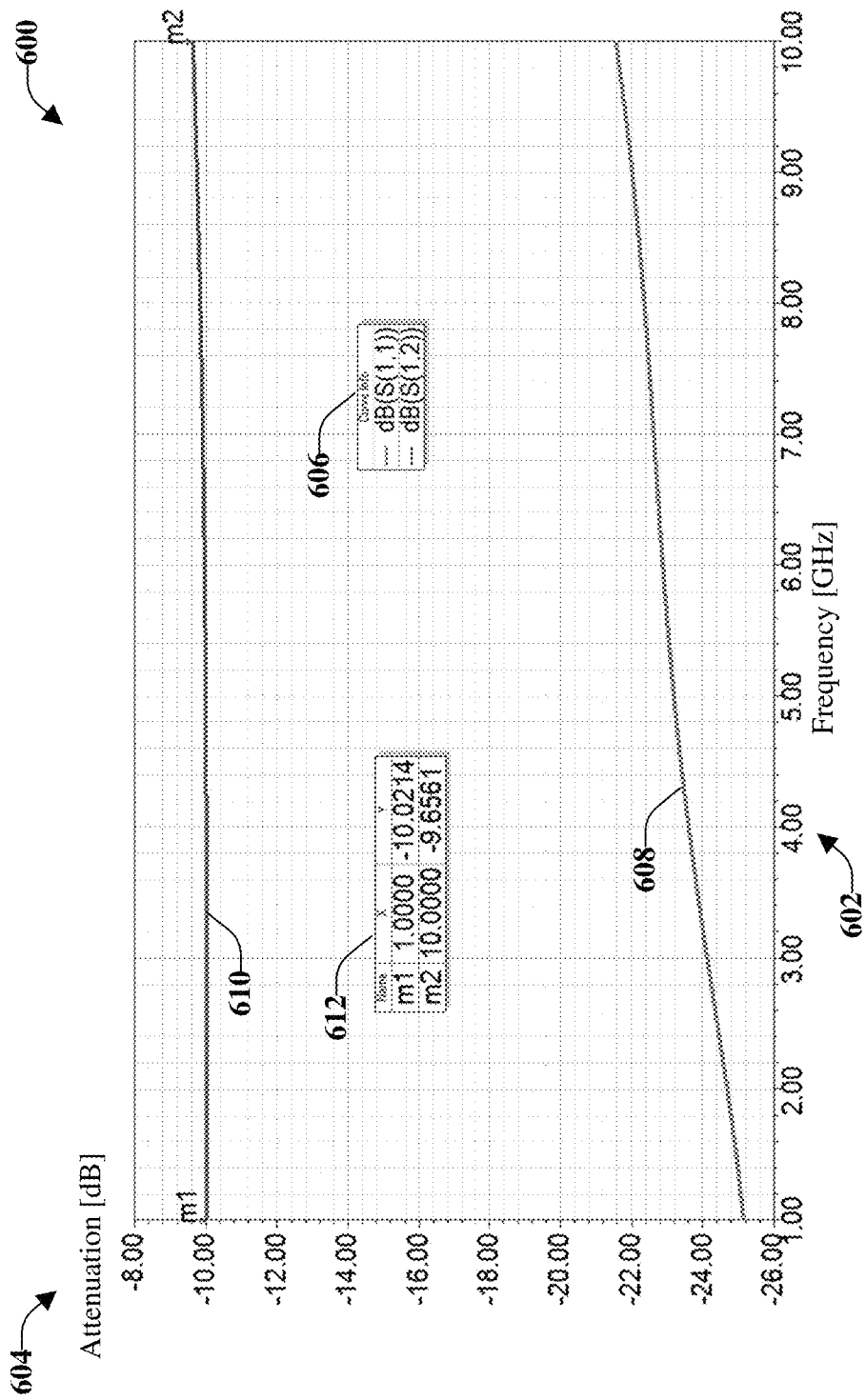
FIG. 6 illustrates an example, non-limiting plot of a microwave simulation for the attenuator design of FIG. 5.

FIG. 6 illustrates an example, non-limiting plot 600 of a microwave simulation for the attenuator design of FIG. 5 in accordance with one or more embodiments described herein. Frequency 602, expressed in GHz, is illustrated on the horizontal axis (X axis) and attenuation 604, expressed in dB, is illustrated on the vertical axis (Y axis).

As illustrated by the first label box 606, a first curve 608 (e.g., the bottom curve) represents a microwave simulation transmission measurement (S(1,1)) and a second curve 610 (e.g., the top curve) represents a microwave simulation reflection measurement (S(1,2)). For the microwave simulation transmission measurement (S(1,1)), a signal can be input on a first end (e.g., input connector) of the attenuator and measured at a second end (e.g., output connector) of the attenuator. For the microwave simulation reflection measurement (S(1,2)), a signal can be input on a first end of the attenuator, bounces back, and returns to the first end.

As illustrated in the second label box 612, for the microwave simulation transmission measurement (S(1,1)), marker 1 (m1), associated with the first curve 608, indicates that when the frequency is 1.0 GHz (X axis), then the attenuation is negative 10.0214 dB (Y axis). Further, as illustrated by marker 2 (m2), associated with the first curve 608, when frequency is 10.0 GHz (X axis), the attenuation is negative 9.6561 dB (Y axis). Further, as illustrated by the microwave simulation reflection measurement (S(1,2)), the illustrated design can be for a 1 GHz to 10 GHz frequency. Thus, the S-parameters can be relatively flat within the 10 decibel (dB) or 20 dB band of interest (e.g., 1 to 10 GHz). Further, reflection can be minimized and/or reduced, while thermalization can be optimized.

It is noted that the attenuator design illustrated and described with reference to FIGS. 2-6 is for a 10 dB attenuator. However, the disclosed aspects are not limited to a 10 dB attenuator. Instead, the various aspects discussed herein can be utilized for a 20 dB attenuator, a 30 dB attenuator, a 40 dB attenuator, a 50 dB attenuator, and so on. For example, the disclosed aspects can be scaled linearly (e.g., by increasing the cross-type design accordingly) for the higher dB amounts. In an example, the grooved lines can be wider for a 20 dB attenuator than the lines illustrated for the 10 dB attenuator.

Figure 7:
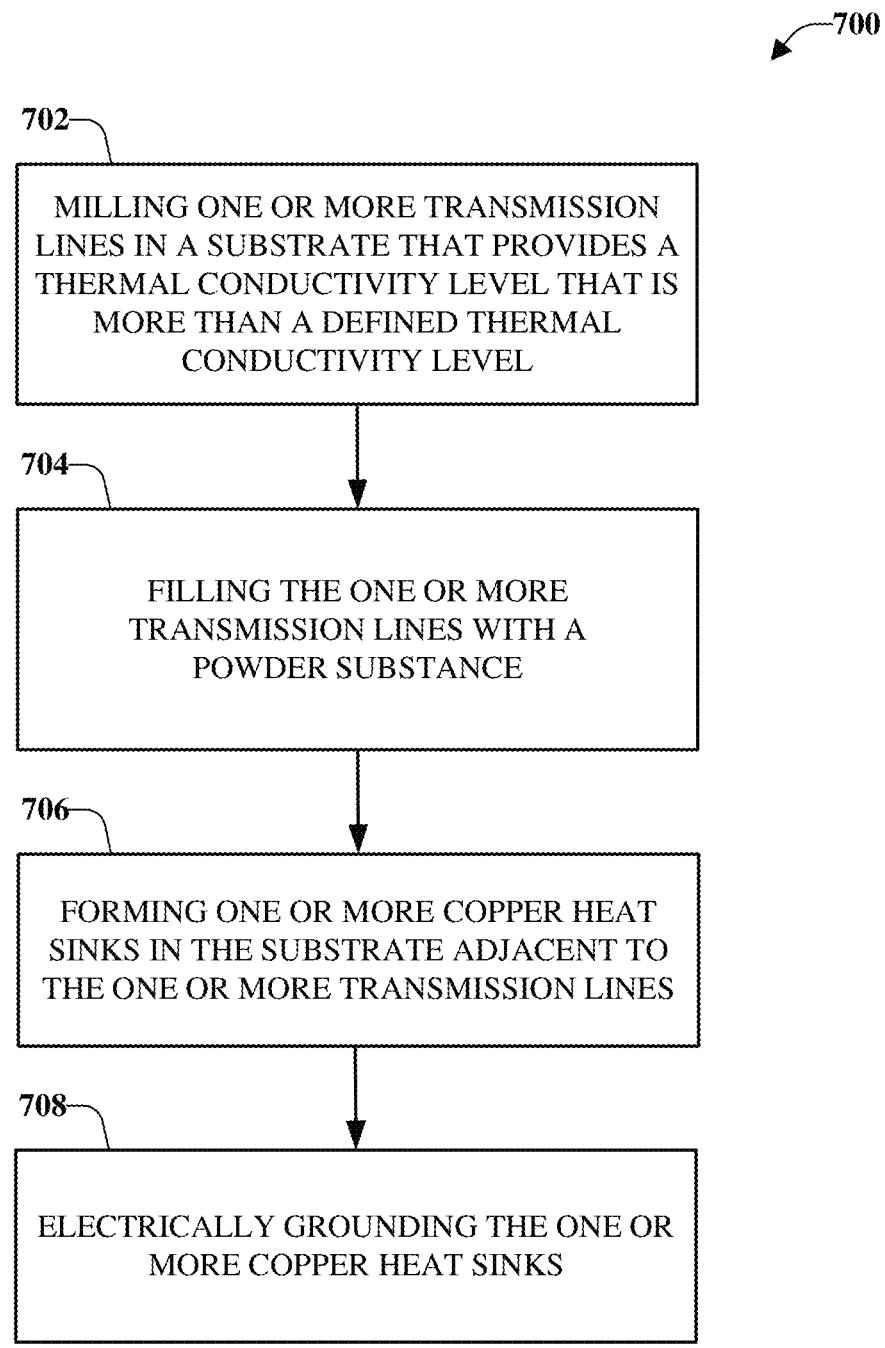
FIG. 7 illustrates a flow diagram of an example, non-limiting, method for fabricating a reduce thermal resistance attenuator in accordance with one or more embodiments described herein.

FIG. 7 illustrates a flow diagram of an example, non-limiting, method 700 for fabricating a reduce thermal resistance attenuator in accordance with one or more embodiments described herein. Repetitive description of like elements employed in other embodiments described herein is omitted for sake of brevity.

The method 700 starts, at 702, when one or more transmission lines (e.g., the first transmission line $302_1$, the second transmission line $302_2$, and the third transmission line $302_3$) can be milled in a substrate (e.g., the substrate 202). The substrate can provide a thermal conductivity level that can be more than a defined thermal conductivity level. According to some implementations, the thermal conductivity level of the substrate can be in a range of about 100 watts to about 200 watts per meter per Kelvin (W/m/K). The substrate can be a sapphire substrate, a silicon substrate, a fuse silica substrate, a quartz substrate, a MgO substrate, a GaAs substrate, or combinations thereof.

At 704, the one or more transmission lines can be filled with a powder substance (e.g., respective powder substances $402_1$, $402_2$, and $402_3$). For example, the powder substance can comprise particles that can be packed into the one or more transmission lines. According to some implementations, resistors can be formed from the one or more transmission lines packed with the powder substance.

One or more copper heat sinks can be formed in the substrate adjacent to the one or more transmission lines, at 706. The one or more copper heat sinks can be formed from two or more grooves or trenches in the substrate.

Further, at 708, the one or more copper heat sinks can be electrically grounded. The heat sinks can be pieces of copper (or filled with a copper powder (e.g., the respective copper powder $406_1$ and $406_2$) that can provide a ground connection. Further, the one or more heat sinks can absorb heat from the resistors (e.g., Joule heating). According to an implementation, the resistors can comprise a metal alloy with a relatively high resistivity level.

Accordingly, the various aspects can provide an improved design both from a microwave and thermal perspective. Microstrip lines can improve microwave signals, can avoid slotline modes, and can enable the use of grooved lines (thick metal) to improve thermalization lowering Kapitza resistance. The one or more heat sinks can rely on thermal conduction other than electron-phono coupling. In addition, thick (e.g., around 0.5 mm to about 1 mm) conductors for both the transmission lines and the heat sinks can be utilized.

Figure 8:
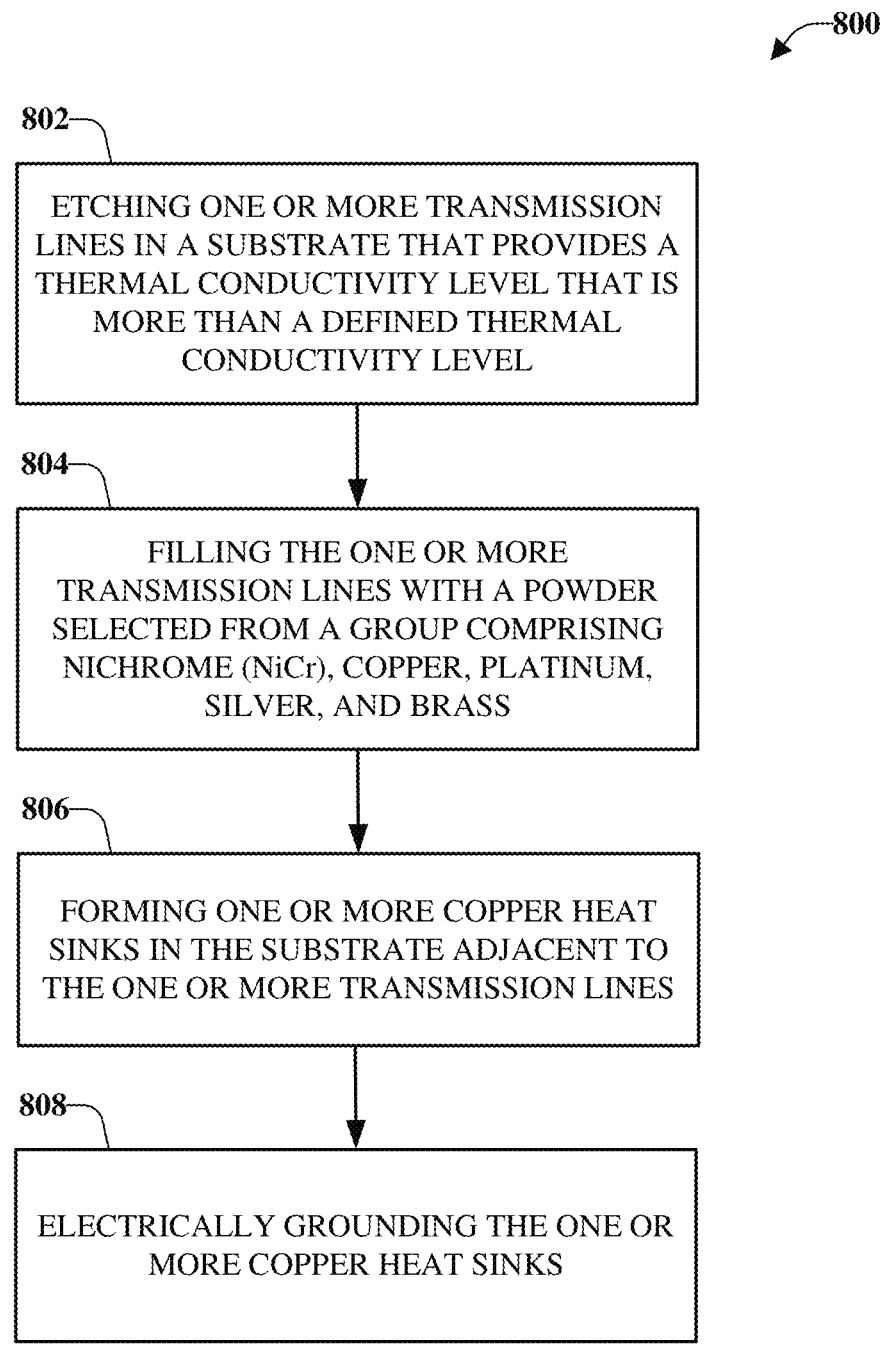
FIG. 8 illustrates a flow diagram of an example, non-limiting, method that facilitates increasing a surface area of one or more transmission lines to reduce thermal resistance in accordance with one or more embodiments described herein.

FIG. 8 illustrates a flow diagram of an example, non-limiting, method 800 that facilitates increasing a surface area of one or more transmission lines to reduce thermal resistance in accordance with one or more embodiments described herein. Repetitive description of like elements employed in other embodiments described herein is omitted for sake of brevity.

At 802 of the method 800, one or more transmission lines (e.g., the trenches for the first transmission line $302_1$, the second transmission line $302_2$, and the third transmission line $302_3$) can be etched in a substrate (e.g., the substrate 202) that can provide a thermal conductivity level that can be more than a defined thermal conductivity level. Further, at 804, the one or more transmission lines can be filled with a powder. For example, the powder can be Nichrome (NiCr) powder. According to another example, the powder can be copper powder. In another example, the powder can be platinum powder. In accordance with another example, the powder can be silver powder. In yet another example, the powder can be brass powder. According to some implementations, the powder can be a combination of one or more of nichrome (NiCr) powder, copper powder, platinum powder, silver powder, and brass powder.

One or more copper heat sinks can be formed in the substrate, at 806. The one or more copper heat sinks can be formed adjacent to the one or more transmission lines. For example, the one or more copper heat sinks can be formed by creating trenches (e.g., trenches for the first heat sink $306_1$ and the second heat sink $306_2$) in the substrate. Further, the trenches can be filled with a copper powder (e.g., the respective copper powder $406_1$ and $406_2$) to create the one or more copper heat sinks. At 808, the one or more copper heat sinks can be electrically grounded.

Accordingly, the method 800, as well as other aspects discussed herein, relate to a microwave attenuator device. The microwave attenuator device, in accordance with an implementation, can comprise a sapphire substrate providing a thermal conductivity in the range of about 200 W/m/K. Further, the microwave attenuator device can comprise grooved transmission lines filled with NiCr or copper powder. Further, the microwave attenuator device can comprise copper heat sinks that absorb heat from the resistors. The transmission lines can have a lower Kapitza (metal-substrate interfacial thermal resistance) and, due to their thicknesses, electrons can flow in the thin surface layer (approximately 0.5 um, skin depth at around 10 GHz) and metal underneath can absorb thermal energy.

In accordance with various implementations, the attenuator chip can be placed in a housing. For example, the housing can be an oxygen-free or electrolytic high-conductivity copper housing for improved thermalization to refrigerator plates.

Figure 9:
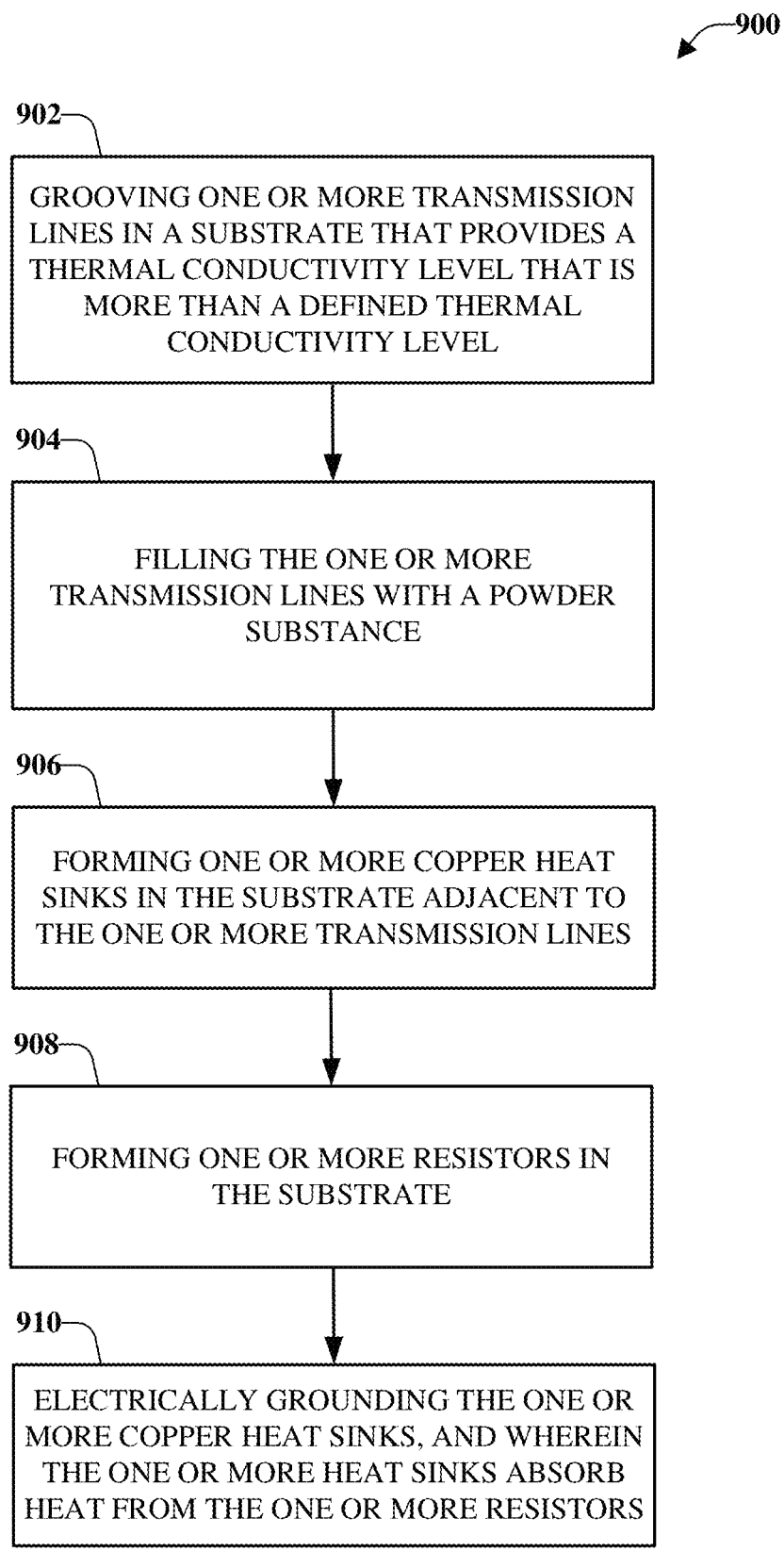
FIG. 9 illustrates a flow diagram of an example, non-limiting, method that facilitates fabrication of a reduced Kaptiza attenuator on high-thermal conductivity substrates for quantum applications in accordance with one or more embodiments described herein.

FIG. 9 illustrates a flow diagram of an example, non-limiting, method 900 that facilitates fabrication of a reduced Kaptiza attenuator on high-thermal conductivity substrates for quantum applications in accordance with one or more embodiments described herein. Repetitive description of like elements employed in other embodiments described herein is omitted for sake of brevity.

One or more transmission lines (e.g., the first transmission line $302_1$, the second transmission line $302_2$, and the third transmission line $302_3$) can be grooved in a substrate (e.g., the substrate 202), at 902. The substrate can provide a thermal conductivity level that can be more than a defined thermal conductivity level. The one or more transmission lines can be filled with a powder substance (e.g., the respective powder substances $402_1$, $402_2$, and $402_3$) at 904. For example, the powder substance can be NiCr/copper powder, however other types of powder can be utilized. For example, the powder can be a metal alloy with a relatively high resistivity (e.g., in the range of 100 uOhm cm). Further, a sintering recipe can be utilized. For example, the sintering recipe can specify that once the powder is placed in the grooves, the powder can be compressed. The compression can be formed with a piston or another manner of compressing the powder, or pushing the powder deep into the grooves. The grooves can be filled to the top of the substrate with powder. Then, the attenuator can be placed in a furnace and baked for a defined amount of time at a defined temperature. According to one example, the defined amount of time can be four hours and the define temperature can be 400° C. However, it is noted that the disclosed aspects are not limited to this example.

One or more copper heat sinks can be formed in the substrate adjacent to the one or more transmission lines, at 906. The one or more copper heat sinks can be formed as trenches (e.g., the respective trenches for the first heat sink $306_1$ and the second heat sink $306_2$) filled with powder (e.g., the respective copper powder $406_1$ and $406_2$), which can be formed deeper into the substrate than the trenches for the one or more transmission lines.

At 908, one or more resistors can be formed in the substrate (e.g., the trenches for the resistors $304_1$, $304_2$, $304_3$, and $304_4$). According to an implementation, the one or more resistors can comprise a powder substance (e.g., the respective powder substances $404_1$, $404_2$, $404_3$, and $404_4$), which can be an alloy with a relatively high resistivity level. At 910 the one or more copper heat sinks can be electrically grounded. Further, the one or more heat sinks can absorb heat from the one or more resistors.

As discussed herein, provided is a dissipative device in the form of a microwave attenuator that can reduce and/or mitigate signal magnitude, reduce and/or mitigate thermal noise, and thermalize conductors at the one or more stages (e.g., plates) in the dilution refrigerator (e.g., the cryostat 100). The disclosed aspects provide a thermally aware microwave attenuator for quantum applications. The microwave attenuator design can reduce and/or mitigate thermal noise and optimize thermalization in dilution refrigerators for quantum applications while retaining a state of the art microwave response for the attenuator.

The various aspects include a standalone microwave attenuator for cryogenic applications on a high thermal conductivity substrate. Further, microstrip lines can be utilized as well as thick (e.g., around 0.5 mm to about 1 mm) conductors, which applies both to transmission lines and heat sinks. In addition, provided is an improved design both from a microwave and thermal perspective. Microstrip lines can improve microwave signals, avoid slotline modes, and can enable the use of grooved lines (thick metal) to improve thermalization lowering Kapitza resistance. The heat sinks can rely on thermal conduction other than electron-phono coupling. Further, the attenuator design can be utilized in temperatures ranging from about 1° K to around 100° K, for example.

For simplicity of explanation, the methods or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
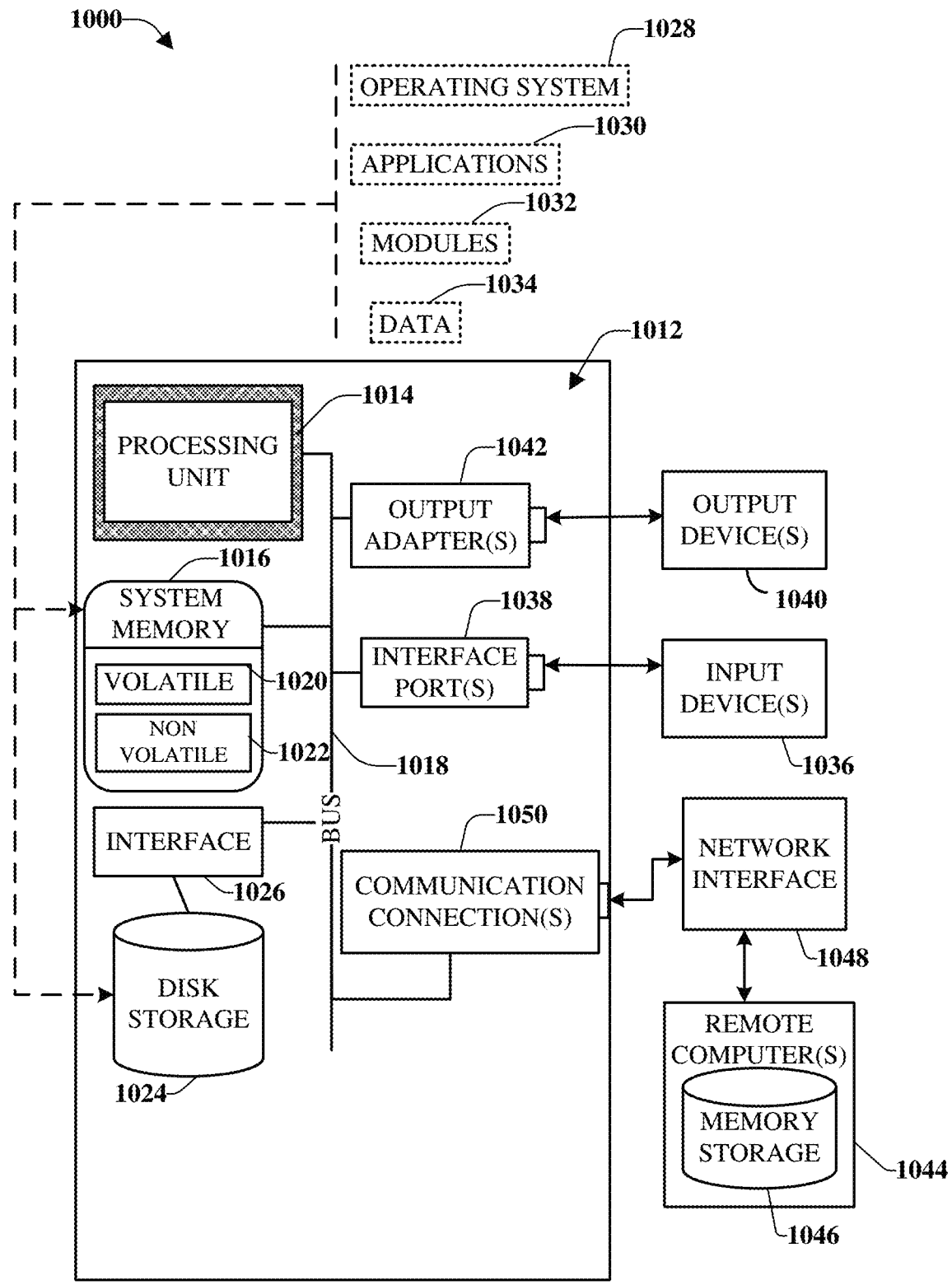
FIG. 10 illustrates a block diagram of an example, non-limiting operating environment in which one or more embodiments described herein can be facilitated.

To provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/ software employed to connect the network interface 1048 to the system bus 1018. While communication connection 1050 is shown for illustrative clarity inside computer 1012, it can also be external to computer 1012. The hardware/ software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   milling in a substrate one or more grooves for one or more transmission lines that provides a thermal conductivity level that is more than a defined thermal conductivity level, the one or more grooves having a first depth and having disposed within the transmission lines and at least one resistor of one or more resistors;
   providing the one or more transmission lines in the substrate; and
   forming one or more heat sinks in the substrate; wherein the providing the one or more grooves for transmission lines in the substrate comprises filling the one or more grooves for transmission lines with a powder substance.

2. The method of claim 1, wherein the powder substance is selected from a group consisting of Nichrome (NiCr), copper, platinum, silver, and brass.

3. The method of claim 1, wherein the thermal conductivity level of the substrate is in a range of about 100 to 200 watts per meter per Kelvin (W/m/K).

4. The method of claim 1, wherein the substrate comprises a material selected from a group consisting of sapphire, silicon, fused silica, quartz, Magnesium Oxide (MgO), and Gallium Arsenide (GaAs).

5. The method of claim 1, wherein the one or more transmission lines facilitate thermalization to reduce a metal-substrate interfacial thermal resistance.

6. The method of claim 1, further comprising:
   providing a ground plane, wherein the substrate is located over the ground plane.

7. The method of claim 1, wherein the one or more heat sinks have a second depth that is greater than the first depth.

8. The method of claim 1, further comprising:
   forming the one or more resistors in the grooves in the substrate.

9. The method of claim 8, wherein the one or more resistors comprise an alloy comprising a high resistivity level.

10. The method of claim 9, wherein the one or more heat sinks absorb heat from the one or more resistors.

11. The method of claim 9, wherein the high resistivity level comprises a resistivity level around 100 microhm centimeter.

* * * * *